US011935982B2

(12) United States Patent
O'Brien et al.

(10) Patent No.: US 11,935,982 B2
(45) Date of Patent: Mar. 19, 2024

(54) SEMICONDUCTOR STRUCTURE ARRANGEMENT, METHODS FOR PRODUCING A SEMICONDUCTOR STRUCTURE ARRANGEMENT AND OPTOELECTRONIC DEVICE

(71) Applicant: OSRAM Opto Semiconductors GmbH, Regensburg (DE)

(72) Inventors: David O'Brien, Portland, OR (US); Erik Johansson, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 773 days.

(21) Appl. No.: 16/855,660

(22) Filed: Apr. 22, 2020

(65) Prior Publication Data
US 2021/0336072 A1    Oct. 28, 2021

(51) Int. Cl.
*H01L 31/09* (2006.01)
*H01L 31/02* (2006.01)
*H01L 31/048* (2014.01)

(52) U.S. Cl.
CPC ........ *H01L 31/09* (2013.01); *H01L 31/02024* (2013.01); *H01L 31/048* (2013.01)

(58) Field of Classification Search
CPC . H01L 31/09; H01L 31/02024; H01L 31/048; H01L 33/465; H01L 33/507; H01L 2933/0041; H01L 33/501; H01L 33/505; H01L 33/502; H01L 33/50; H01L 33/46; H01L 33/52; H01L 33/54; H01L 33/56; H01L 2933/005; C09K 11/025; Y02E 10/50
See application file for complete search history.

(56) References Cited

U.S. PATENT DOCUMENTS

| 9,478,717 B2 | 10/2016 | Haley et al. | |
| 2013/0250544 A1* | 9/2013 | Zink | H01L 33/505 |
| | | | 359/326 |
| 2017/0331009 A1* | 11/2017 | Shioji | H01L 33/502 |

(Continued)

FOREIGN PATENT DOCUMENTS

CN    110676250 A  *  1/2010   ........... H01L 33/504

OTHER PUBLICATIONS

Pühringer, H. et al., "Enhanced color conversion from colloidal CdSe/CdS dot/rods by vertical microcavities", Applied Physics Letters, Oct. 2010, pp. 111115-111115-3, vol. 97, Issue 11.

(Continued)

*Primary Examiner* — Nilufa Rahim
(74) *Attorney, Agent, or Firm* — Viering, Jentschura & Partner mbB; Benjamin L. von Rueden

(57) ABSTRACT

An arrangement is disclosed. The arrangement comprises at least one semiconductor structure configured to convert a primary radiation into a secondary radiation; an encapsulation layer covering the at least one semiconductor structure; and at least one reflective layer arranged on the encapsulation layer. The semiconductor structure is arranged in a center of the arrangement, and a lateral extent of the arrangement is chosen such that an optically resonant condition is fulfilled for a wavelength of the secondary radiation in the encapsulation layer. Methods for producing an arrangement and an optoelectronic device are also disclosed.

20 Claims, 3 Drawing Sheets

(56) References Cited

U.S. PATENT DOCUMENTS

2018/0122991 A1* 5/2018 Lee ..................... H01L 33/387
2019/0225535 A1* 7/2019 Schmidt ................... C03C 4/12

OTHER PUBLICATIONS

Enderlein, Jörg, "Theoretical study of single molecule fluorescence in a metallic nanocavity", Applied Physics Letters, Jan. 14, 2002, pp. 315-317, vol. 80, Issue 2.

Pempedocles, S.A. et al., "Photoluminescence Spectroscopy of Single CdSe Nanocrystallite Quantum Dots", Physical Review Letters, Oct. 28, 1996, pp. 3873-3876, vol. 77, Issue 18.

International search report issued for the corresponding PCT patent application No. PCT/EP2021/059563, dated Jul. 12, 2021, 19 pages (for informational purposes only).

Garcia-Santamaria, Florencio et al., "Suppressed Auger Recombination in "Giant" Nanocrystals Boosts Optical Gain Performance", Nano Letters, 2009, pp. 3482-3488, vol. 9, Issue 10.

Jasieniak, Jacek et al., "Sol-Gel Based Vertical Optical Microcavities with Quantum Dot Defect Layers", Advanced Functional Materials, Dec. 2008, vol. 18, Issue 23.

Botao, Ji et al., "Non-blinking quantum dot with a plasmonic nanoshell resonator", Nature Nanotechnology, Feb. 2015, pp. 170-175, vol. 10.

* cited by examiner

SEMICONDUCTOR STRUCTURE ARRANGEMENT, METHODS FOR PRODUCING A SEMICONDUCTOR STRUCTURE ARRANGEMENT AND OPTOELECTRONIC DEVICE

TECHNICAL FIELD

The invention relates to an arrangement. It further relates to methods of producing an arrangement and an optoelectronic device.

BACKGROUND

As is known in the art, an arrangement of a semiconductor structure with a reflective layer at an optical resonant distance from the semiconductor structure causes the excitons in the semiconductor structure to have reduced radiative lifetimes due to the Purcell effect. Reduced radiative lifetimes are a result of enhanced spontaneous emission rates and can reduce the amount of multi-exciton states. Multi-exciton states result from high flux conditions, where, for example, materials are arranged in close proximity to an LED chip that is driven to very high light intensities. Multi-exciton states can lower the quantum efficiency by non-radiative Auger recombination and lead to a condition known as flux droop, where the photoluminescence efficiency drops as pump level increases. Multi-exciton states can also be responsible for various processes such as photo-ionization at the particle surface and degradation or quenching of the emission that can degrade the semiconductor structure and stability, which is undesirable.

SUMMARY

An optoelectronic device with a conversion element comprising or consisting of the arrangement described below and throughout has an enhanced quantum efficiency and photoluminescence efficiency in high flux applications. Thus, the semiconductor chip can be driven to very high light intensities without the photoluminescence efficiency decreasing due to auger generated flux droop. In addition, the stability of the semiconductor structures and the arrangement is increased by reducing the carrier lifetime and/or the carrier density in the semiconductor structure.

It is an object of the invention to provide an arrangement with improved quantum efficiency. It is a further object to provide methods for producing an arrangement with improved quantum efficiency and an optoelectronic device comprising an arrangement with improved quantum efficiency.

According to at least one embodiment, an arrangement is provided. The arrangement can comprise different elements, components, or parts with specific, in particular different, properties.

According to at least one embodiment, the arrangement comprises at least one semiconductor structure configured to convert the primary radiation into a secondary radiation. In particular, the semiconductor structure is configured or designed to absorb incident electromagnetic radiation of a first wavelength range, a primary radiation, convert the primary radiation into electromagnetic radiation of a second wavelength range, a secondary radiation, and emit the secondary radiation. In other words, the semiconductor structure may be or comprise a conversion material. The arrangement may comprise exactly one semiconductor structure or exactly two semiconductor structures or a plurality of semiconductor structures, for example ten or more semiconductor structures.

According to at least one embodiment, the arrangement comprises an encapsulation layer covering the at least one semiconductor structure. The encapsulation layer can be configured or designed as a passivation layer for electronic passivation and/or as a protection layer for protecting against degradation due to, for example, harmful gases, air or moisture. In particular, the encapsulation layer can surround at least partially, preferably completely, the semiconductor structure. The encapsulation layer can be in direct contact to the semiconductor structure. Alternatively, further layers can be arranged between the semiconductor structure and the encapsulation layer.

According to at least one embodiment, the arrangement comprises at least one reflective layer arranged on the encapsulation layer. A reflective layer is configured or designed to reflect electromagnetic radiation partially or completely. For example, the at least one reflective layer is configured as a reflective interface. In particular, the at least one reflective layer is configured to reflect the secondary radiation.

According to at least one embodiment, the semiconductor structure is arranged in a center of the arrangement. "Center of the arrangement" here and in the following refers to a center of symmetry in at least one extension direction of the arrangement. In other words, the semiconductor structure is arranged in the arrangement in such a way that the semiconductor structure has an identical or essentially identical distance to the at least one reflective layer in both directions of the at least one extension direction. Here and in the following, essentially can in particular mean a deviation of less than 10%, in particular of less than 5%. In particular, the semiconductor structure can be arranged in a center of the arrangement that is the center of symmetry in more than one extension direction of the arrangement.

According to at least one embodiment, a lateral extent of the arrangement is chosen such that an optically resonant condition is fulfilled for a wavelength of the secondary radiation in the encapsulation layer. In particular, "lateral extent" refers to the extension of the arrangement in at least one extension direction of the arrangement. For example, a wavelength of the secondary radiation in the encapsulation layer is the wavelength of the second wavelength range at which the secondary radiation has its greatest intensity.

An optically resonant condition is fulfilled when the at least one reflective layer is essentially arranged at an optically resonant distance from the semiconductor structure with respect to the secondary radiation. The optical resonant distance depends on the wavelength of the secondary radiation and the refractive index of the material of the encapsulation layer. With the at least one reflective layer essentially arranged at an optically resonant distance from the semiconductor structure, an optical cavity is formed around the semiconductor structure in which a standing wave can be formed. In particular, the standing wave can have an antinode in the center of the arrangement. Thus, the amplitude of the wave comprises a maximum in the area where the semiconductor structure is located. It should be noted that the reflective layer can be thin compared to the encapsulation layer. Thus, the lateral extent of the optical cavity may be mostly determined by the thickness of the encapsulation layer.

In an ideal case, the semiconductor structure is arranged in the location of the maximum amplitude of the standing wave for gaining the most effect. In reality, the effect has a peak at the center where the maximum amplitude of the standing wave is located and the effect rolls off to the sides. In other words, the semiconductor structure is not necessarily required to be arranged in the exact center of the arrangement. In particular, the semiconductor structures are still arranged at an optically resonant distance to the reflective layers if the lateral extent of the arrangement is greater than the lateral extent of the semiconductor structures by at least a factor of 5, in particular by at least a factor of 10, and the location of the semiconductor structures deviates from the center of the arrangement by at most twice their own lateral extent or diameter. For example, the semiconductor structure has a lateral extent of tens of nanometers and the encapsulation layer has a lateral extent of hundreds of nanometers. Thus, the semiconductor structure can be arranged with a deviation of tens of nanometers from the center of the arrangement.

According to at least one embodiment, the arrangement comprises at least one semiconductor structure configured to convert the primary radiation into a secondary radiation, an encapsulation layer covering the at least one semiconductor structure, and at least one reflective layer arranged on the encapsulation layer, wherein the semiconductor structure is arranged in a center of the arrangement, and wherein a lateral extent of the arrangement is chosen such that an optically resonant condition is fulfilled for a wavelength of the secondary radiation.

As stated above, an arrangement with a reflective layer at an optical resonant distance from the semiconductor structure causes the excitons in the semiconductor structure to have reduced radiative lifetimes due to the Purcell effect. Reduced radiative lifetimes are a result of enhanced spontaneous emission rates and can reduce the amount of multi-exciton states. Multi-exciton states result from high flux conditions, where, for example, materials are arranged in close proximity to an LED chip that is driven to very high light intensities. Multi-exciton states can lower the quantum efficiency by non-radiative Auger recombination and lead to a condition known as flux droop, where the photoluminescence efficiency drops as pump level increases. Multi-exciton states can also be responsible for various processes such as photo-ionization at the particle surface and degradation or quenching of the emission that can degrade the semiconductor structure and stability. Reducing the number of multi-exciton states by varying the surrounding optical environment to reduce the radiative lifetimes of the excitons decreases the Auger generated flux droop and enhances the quantum efficiency and the photoluminescence efficiency as well as the stability of the semiconductor structure in high flux applications.

The reflective surface can also reduce the amount of light absorbed by the semiconductor structure for a given high flux condition and so reduce the carrier density per wavelength converting material of or in the semiconductor structure. In this case, more wavelength converting material is required to reach the same level of conversion, but the stress on the wavelength conversion material is reduced leading to better performance.

According to at least one embodiment, a lateral extent of the arrangement is essentially $N \cdot \lambda/2$. Thereby, $\lambda$ is a wavelength of the secondary radiation in the encapsulation layer. For example, $\lambda$ is the wavelength of the second wavelength range at which the secondary radiation has its greatest intensity. Further, N is an odd natural number. For odd natural numbers for N, the standing wave has an antinode in the center of the arrangement. In particular, N can be 1, 3, 5 or even higher odd natural numbers. Here and in the following, essentially can in particular mean a deviation of less than 10%, in particular of less than 5%. A lateral extent of the arrangement of essentially $N \cdot \lambda/2$ fulfills the optically resonant condition for a wavelength of the secondary radiation in the encapsulation layer.

According to at least one embodiment, the arrangement comprises exactly one semiconductor structure and the arrangement is spheroidal, for example spherical. In other words, the arrangement comprises one semiconductor structure in the center of the arrangement surrounded by the encapsulation layer further surrounded by one reflective layer. The lateral extent, here for example a diameter, of such a spheroidal or spherical arrangement is chosen such that an optically resonant condition is fulfilled for a wavelength of the secondary radiation in the encapsulation layer. For example, the lateral extend of the spheroidal structure is essentially $N \cdot \lambda/2$ of a wavelength of the secondary radiation in the encapsulation layer.

According to at least one embodiment, the at least one semiconductor structure comprises at least one semiconductor nanocrystal. A semiconductor nanocrystal comprises at least a core and shell. The core and/or the shell comprises at least one semiconductor material. In addition, the semiconductor nanocrystal can comprise further shells and/or layers. In particular, the semiconductor nanocrystal can be individually coated with an oxide for passivation and protection. Semiconductor structures with semiconductor nanocrystals can have a very high packing density of active centers that can be placed at well-defined fixed distances from a reflective layer which is advantageous compared to phosphor particles in which the active centers are scattered randomly around a crystal.

According to at least one embodiment, the at least one semiconductor structure is a semiconductor nanocrystal. In other words, the semiconductor structure consists of a semiconductor nanocrystal.

According to at least one embodiment, the at least one semiconductor structure is an oxide coated semiconductor nanocrystal. In other words, the semiconductor structure consists of an oxide coated semiconductor nanocrystal.

According to at least one embodiment, the at least one semiconductor structure is an agglomerate of a plurality of semiconductor nanocrystals. In an agglomerate, the plurality of semiconductor nanocrystals are agglomerated meaning associated to one another by bonds and/or interactions such as covalent bonds and/or physical or chemical interactions, for example, van der Waals interactions.

According to at least one embodiment, the at least one semiconductor structure is an agglomerate of a plurality of individually oxide coated semiconductor nanocrystals. In this instance, the individually oxide coated semiconductor nanocrystals can be agglomerated by forming covalent bonds between the individual oxide coatings of the semiconductor nanocrystals.

According to at least one embodiment, the agglomerate comprises at least two semiconductor nanocrystals. In particular, the agglomerate comprises at least 3, 4, 5, 6, 7, 8, 9, 10, or more semiconductor nanocrystals. Obviously, these numbers also apply to an agglomerate comprising individually oxide coated semiconductor nanocrystals.

According to at least one embodiment, the agglomerate is further coated with an oxide. The oxide coating can surround the agglomerated semiconductor nanocrystals for protection and/or passivation.

According to at least one embodiment, the encapsulation layer comprises a metal oxide. In particular, the encapsulation layer comprises a metal oxide based, inorganic material.

For example, the encapsulation layer comprises or consists of silica, alumina, zirconia, hafnium oxide, strontium oxide, tin oxide. Metal oxides, in particular silica, can be homogeneously deposited around the semiconductor structure, for example, with wet or dry chemical deposition methods. This makes it possible that the distance from the semiconductor structure to the reflective layer is well defined which increases the effect of reducing the carrier lifetimes.

According to at least one embodiment, the at least one reflective layer comprises Ag, Al, Pt, Pd, alloys thereof, or Ni—P alloys.

According to at least one embodiment, the at least one reflective layer comprises or consists of Ag. Ag is particularly suited for the reflective layer since it comprises a high reflectivity for the secondary radiation without absorbing a high amount of the primary radiation.

According to at least one embodiment, the at least one reflective layer comprises or consists of Al. Al tends to self-passivated in contact with oxygen forming aluminum oxide, $Al_2O_3$, thus producing a passivation on the surface of the reflective layer. While the self-passivation of the surface of the reflective layer may be beneficial for maintaining a stable reflective layer during operation, the synthesis of a reflective layer comprising Al has to be carried out without oxygen to avoid aluminum oxide formation during deposition.

According to at least one embodiment, the at least one reflective layer comprises a Bragg stack. In particular, a Bragg stack or Bragg reflector is a reflector formed from multiple layers of alternating materials with varying refractive index. Each layer boundary causes a partial reflection of the incident electromagnetic radiation. In particular, the Bragg stack comprises or consists of a layer sequence of transparent materials with different refractive indices.

According to at least one embodiment, the Bragg stack has a good reflectivity for the secondary radiation and a high transmittance for the primary radiation. In particular, the reflectivity for the secondary radiation is at least 75%, preferably at least 90%. In particular, the transmittance for the primary radiation is at least 75%, preferably at least 90%. For example, the Bragg stack is spectrally tuned so as to have a good resonant condition for the secondary wavelength such as red radiation and a low absorption and thus a high transmittance for the primary radiation such as blue radiation.

According to at least one embodiment, the reflectivity and the absorptivity of the reflective layer are adjustable by the thickness of the reflective layer and the material of the reflective layer. For optimum results, the reflective layer needs to be reflective for the secondary radiation, but not absorptive for the primary radiation. In particular, decreasing the thickness of the reflective layer leads to a decreasing absorptivity and a decreasing reflectivity, whereas increasing the thickness of the reflective layer leads to an increasing absorptivity and an increasing reflectivity. Thus, there is a tradeoff between reflectivity and absorptivity. In particular, this tradeoff is material dependent.

According to at least one embodiment, the arrangement is formed as a layer, and the arrangement comprises at least two reflective layers and a plurality of semiconductor structures. In other words, the plurality of semiconductor structures is arranged in the encapsulation layer and one reflective layer is arranged on one side of the encapsulation layer and the other reflective layer is arranged on the other side of the encapsulation layer. In such a layered arrangement, the center of the arrangement is defined as the middle between the two reflective layers. In this instance, the lateral extent refers to the extension direction orthogonal or perpendicular to the extension direction of the reflective layers. Thus, the lateral extent of the arrangement can be referred to as the thickness of the layered arrangement. The thickness of the arrangement is chosen such that an optically resonant condition is fulfilled for a wavelength of the secondary radiation in the encapsulation layer. For example, the lateral extend of the layered arrangement is essentially $N·\lambda/2$ of a wavelength of the secondary radiation in the encapsulation layer.

According to at least one embodiment, the arrangement comprises at least one monolayer of semiconductor structures arranged in the encapsulation layer between the at least two reflective layers, and each semiconductor structure has essentially the same distance to both reflective layers. Here and in the following, essentially can in particular mean a deviation of less than 10%, in particular of less than 5%. In other words, at least one monolayer of semiconductor structures is arranged in the center of the layered arrangement parallel to the reflective layers. Semiconductor structures arranged essentially at the same distance to both reflective layers are located in the arrangement where the antinode of the standing wave in the optical resonant cavity is present.

According to at least one embodiment, the arrangement comprises at least two monolayers of semiconductor structures arranged adjacent to one another in the encapsulation layer between the at least two reflective layers. In particular, the arrangement comprises at least 3 or at least 4 or at least 5, for example, 5 to 10, monolayers of semiconductor structures. In this instance, the distance of the at least two monolayers of semiconductor structures to both reflective layers is not exactly the same. Since the lateral extent of the encapsulation layer and the reflective layers is higher by at least a factor of 5, in particular by at least a factor of 10, the monolayers of semiconductor structures in the center of the arrangement can still experience decreased carrier lifetimes. In addition, increasing the amount of semiconductor structures increases the semiconductor nanocrystal density in the arrangement and thus the level of conversion.

Another aspect of the invention relates to a method for producing an arrangement. The method described here is preferably used to produce the arrangement described here. Features and embodiments of the method are therefore also disclosed for the arrangement and vice versa.

According to at least one embodiment, the method for producing an arrangement comprises the steps of providing a semiconductor structure, applying an encapsulation layer on the semiconductor structure surrounding the semiconductor structure, and applying the reflective layer on the encapsulation layer surrounding the encapsulation layer, wherein the semiconductor structure is arranged in the center of the arrangement, and wherein a lateral extent of the arrangement is chosen such that an optically resonant condition is fulfilled for a wavelength of the secondary radiation in the encapsulation.

The method steps for producing an arrangement described here are not restricted to this order. According to a preferred embodiment, however, they are carried out in this order.

The encapsulation layer can be applied on the semiconductor structure by wet chemical deposition methods such as sol-gel chemistry or other methods such as sputtering or atomic layer deposition (ALD) either after or during the synthesis of the semiconductor structure. In particular, sputtering or other metal oxides deposition methods or combinations thereof can be used. The semiconductor structure is then embedded in the encapsulation layer. In particular, the encapsulation layer comprises a metal oxide, for example silica.

The reflective layer is applied, for example, by sputtering, electroless deposition of metals, or sequential deposition of layers of transparent materials with different refractive indices. In particular, the reflective layer comprises a metal or metal alloy or a Bragg stack.

In particular, the encapsulation layer is in direct contact to the semiconductor structure and the reflective layer is in direct contact to the encapsulation layer. In particular, the arrangement is spheroidal or spherical and thus the lateral extent is the diameter of the arrangement.

With such a method, spheroidal or spherical arrangements with a well-defined distance between the semiconductor structure in the center and the reflective layer surrounding the encapsulation layer can be produced. Homogeneous deposition of materials of the encapsulation layer around the semiconductor structure, as it is the case in wet chemical deposition methods such as sol-gel methods or other methods such as sputtering or ALD, can make it possible that the distance from the semiconductor structure to the reflective layer is well defined.

According to at least one embodiment, the semiconductor structure is a semiconductor nanocrystal or an agglomerate of a plurality of semiconductor nanocrystals. The semiconductor nanocrystal or each of the semiconductor nanocrystals of the plurality of semiconductor nanocrystals and/or the agglomerate of the plurality of semiconductor nanocrystals can be coated with an oxide coating.

According to at least one embodiment, a thickness of the reflective layer is adjusted such that the quantum efficiency has a maximum value. In particular, there is a trade-off between reflectivity and absorptivity of the reflective layer that depends on the thickness and the material of the reflective layer. For optimum results, the reflective layer needs to be reflective for the secondary radiation, but not absorptive for the primary radiation.

According to at least one embodiment, the reflective layer is applied by electroless deposition of metals. For electroless deposition, metal ions and reducing agents are used in solution. The reducing agent is used to precipitate a metal layer onto the surface of the encapsulation layer. In particular, additional reagents may be added to the solution to optimize metal deposition and/or surface charge. Reaction parameters such as temperature and/or concentration of reagents and reactants can be tuned to meet specific metals and coating targets. For example, silver nitrate is used as a metal ion source and ammonia or amines are used as the reducing agent, thus forming a reflective layer of silver on the encapsulation layer.

According to at least one embodiment, an intermediate layer is applied on the encapsulation layer prior to applying the reflective layer. Functionalizing the surface of the encapsulation layer with an intermediate layer enhances metal adhesion and thus optimizes the metal deposition process. For example, the intermediate layer comprises 3-mercaptopropyltrimethoxy silane.

Another aspect of the invention relates to a method for producing an arrangement. The method described here is preferably used to produce the arrangement described here. Features and embodiments of the method are therefore also disclosed for the arrangement and vice versa.

According to at least one embodiment, the method for producing an arrangement comprises the steps of providing a first reflective layer, arranging the first part of an encapsulation layer on the first reflective layer, arranging at least one monolayer, in particular at least five monolayers, of semiconductor structures on the first part of the encapsulation layer, arranging a second part of the encapsulation layer on the at least one monolayer of the semiconductor structures, and arranging a second reflective layer on the second part of the encapsulation layer, wherein the first part and a second part of the encapsulation layer form the encapsulation layer, and wherein a lateral extent of the arrangement is chosen such that an optically resonant condition is fulfilled for a wavelength of the secondary radiation in the encapsulation layer.

The method steps for producing a structure described here are not restricted to this order. According to a preferred embodiment, however, they are carried out in this order.

The first reflective layer is, for example, provided on a substrate, a carrier, or a radiation emitting surface of a LED chip. The first and second reflective layer is applied, for example, by sputtering or sequential deposition of layers of transparent materials with different refractive indices.

The materials of the encapsulation layer can be applied by wet chemical deposition methods such as sol-gel chemistry or other methods such as sputtering or atomic layer deposition (ALD). In particular, the two parts of the encapsulation layer are connected to each other by chemical bonds, in particular covalent bonds. For example, during arranging the second part of the encapsulation layer on the at least one monolayer of semiconductor structures, chemical bonds are formed between the first part and the second part of the encapsulation layer. Thus, after arranging both parts of the encapsulation layer, the individual semiconductor structures forming the monolayer of semiconductor structures are embedded in the encapsulation layer.

The at least one monolayer of semiconductor structures is, for example, arranged on the first part of the encapsulation layer by spin coating.

With such a method, layered arrangements with a well-defined distance between the semiconductor structures and the first and second reflective layers can be produced. Homogeneous deposition of materials of the encapsulation layer on the first reflective layer and the at least one monolayer of semiconductor structures, as it is the case in wet chemical deposition methods such as sol-gel methods or other methods such as sputtering or ALD, can make it possible that the distance from the semiconductor structures to the reflective layers is well defined.

According to at least one embodiment, the semiconductor structure is a semiconductor nanocrystal or an agglomerate of a plurality of semiconductor nanocrystals. The semiconductor nanocrystal or each of the semiconductor nanocrystals of the plurality of semiconductor nanocrystals or the agglomerate of the plurality of semiconductor nanocrystals can be coated with an oxide coating.

According to at least one embodiment, a thickness of the first and second reflective layer is adjusted such that the quantum efficiency has a maximum value. In particular, there is a trade-off between reflectivity and absorptivity of the reflective layers that depends on the thickness and the material of the reflective layers. For optimum results, the reflective layers needs to be reflective for the secondary radiation, but not absorptive for the primary radiation.

Another aspect of the invention relates to an optoelectronic device. Preferably, the optoelectronic device described here comprises at least one structure described above produced with one of the methods described above. Features and embodiments of the optoelectronic device are therefore also disclosed for the structure and the methods and vice versa.

According to at least one embodiment, the optoelectronic device comprises a semiconductor chip configured to emit a primary radiation, and a conversion element configured to convert at least part of the primary radiation into secondary radiation, wherein the conversion element comprises or consists of at least one arrangement described above.

The semiconductor chip can comprise an active layer stack comprising an active region that emits the primary radiation during operation of the device. The semiconductor chip is, for example, a light-emitting diode chip or a laser diode chip. The primary radiation generated in the semiconductor chip can be emitted through a radiation emission surface of the semiconductor chip.

The arrangement either arranged in or forming the conversion element is configured to convert the primary radiation at least partially or completely into a secondary radiation. In particular, the secondary radiation has a wavelength range that is at least partially, preferably completely, different from the wavelength range of the primary radiation. For example, the wavelength range of the secondary radiation is in the visible or IR wavelength range. For example, the secondary radiation comprises a wavelength rage from 450 nm inclusive to 1500 nm inclusive.

The features of the arrangement have already been disclosed in conjunction with the arrangement and the methods for producing the arrangement and also apply to the arrangement in the optoelectronic device.

According to at least one embodiment, the primary radiation is in the visible or UV wavelength range. In particular, the semiconductor chip emits blue primary radiation or red primary radiation or UV primary radiation during operation. For example, the semiconductor chip emits primary radiation in the wavelength range from 300 nm inclusive to 800 nm inclusive.

Advantageous embodiments and developments of the arrangement, the methods of producing an arrangement, and the optoelectronic device will become apparent from the exemplary embodiments described below in conjunction with the figures.

BRIEF DESCRIPTION OF THE DRAWINGS

The foregoing and other objects, features and advantages disclosed herein will be apparent from the following description of particular embodiments disclosed herein, as illustrated in the accompanying drawings.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION

Figure 1:
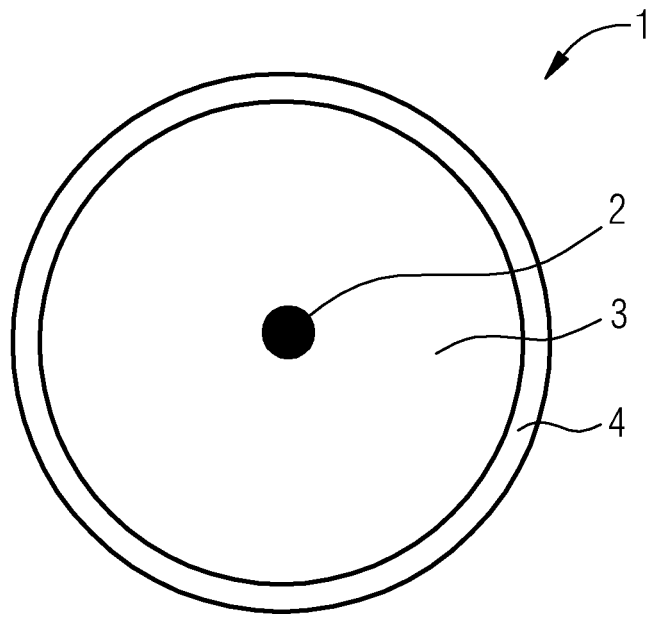
FIGS. 1, 2, and 3 each show a schematic illustration of an arrangement according to different embodiments.
Figure 2:
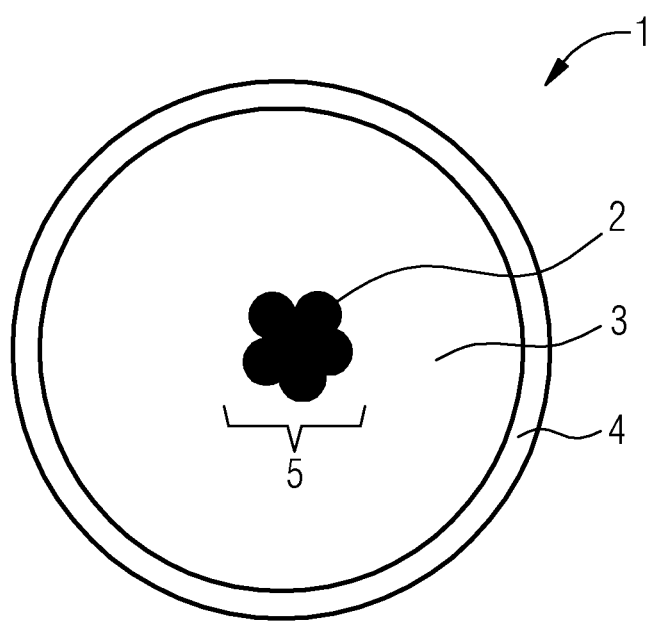
Figure 3:
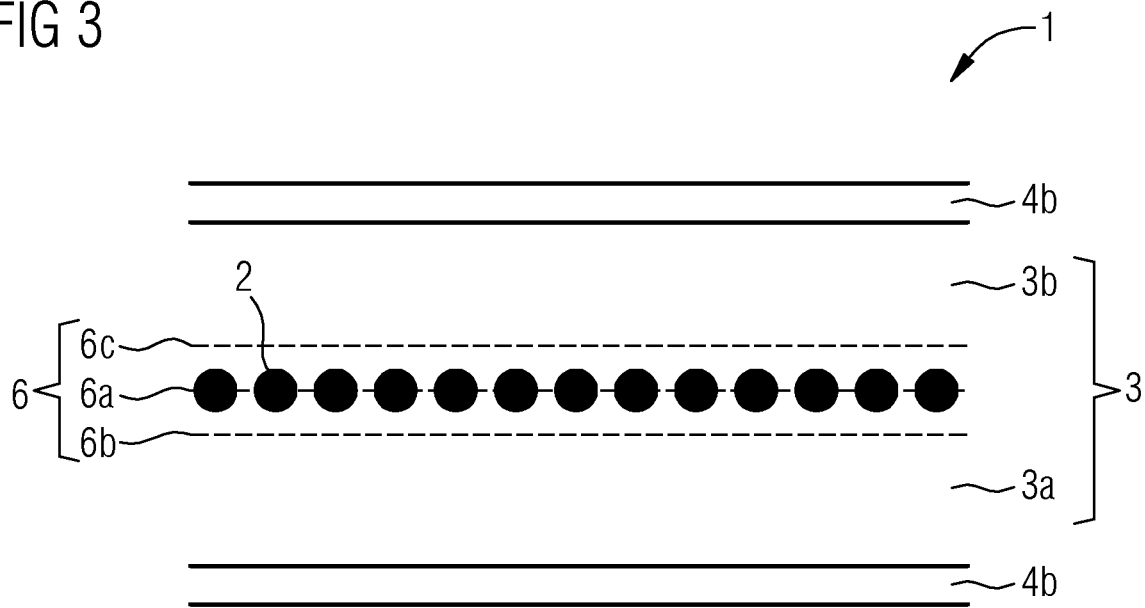

FIGS. 1, 2, and 3 each show a schematic illustration of an arrangement 1.

FIG. 1 shows a spheroidal or spherical arrangement 1 with a semiconductor nanoparticle 2 arranged in the center of the arrangement 1. In this instance, the semiconductor nanocrystal 2 is a semiconductor structure. The semiconductor nanocrystal 2 has a diameter of 5 nm to 20 nm, for example. Optionally, the semiconductor nanocrystal 2 can be oxide coated. The semiconductor nanocrystal 2 is configured to convert a primary radiation into a secondary radiation.

The semiconductor nanocrystal 2 is surrounded with an encapsulation layer 3. In particular, the encapsulation layer 3 is in direct contact to the semiconductor nanocrystal 2. The encapsulation layer 3 comprises or consists of a metal oxide, for example, silica.

The encapsulation layer 3 is surrounded with a reflective layer 4. The reflective layer 4 is thin compared to the thickness of the encapsulation layer 3. In particular, the reflective layer 4 is in direct contact to the encapsulation layer 3. The reflective layer 4 comprises or consists of a metal, for example, Ag or Al, a metal alloy, or a Bragg stack.

The diameter of the spheroidal or spherical arrangement 1 is chosen such that an optically resonant condition is fulfilled for a wavelength of the secondary radiation in the encapsulation layer. For example, the diameter of the spheroidal or spherical arrangement 1 is essentially $N \cdot \lambda/2$, wherein $\lambda$ is a wavelength of the secondary radiation in the encapsulation layer and N is an odd natural number. In other words, the diameter of the arrangement 1 is chosen to be resonant with one emission wavelength. For example, the diameter of the arrangement 1 is resonant with a secondary wavelength in the red wavelength range.

Compared to the arrangement 1 in FIG. 1, the arrangement 1 in FIG. 2 comprises an agglomerate 5 of at least two semiconductor nanocrystals 2. In this instance, the agglomerate 5 is a semiconductor structure. Optionally, each semiconductor nanocrystal 2 can individually be oxide coated. Alternatively or additionally, the agglomerate 5 can optionally be coated with an oxide.

The arrangements 1 of FIGS. 1 and 2 can be produced as follows. The semiconductor nanocrystal 2 or the agglomerate 5 are embedded in the encapsulation layer 3 comprising a metal oxide by using wet chemical processes or other methods such as sputtering or ALD either after or during the synthesis of the semiconductor nanocrystal 2 or the agglomerate 5. For example, sol-gel, sputtering, ALD or other metal oxide deposition methods or combinations thereof can be used. The reflective layer 4 can be applied by sputtering, electroless deposition of metals, or sequential deposition of layers of transparent materials with different refractive indices.

Electroless deposition of metals for applying a reflective layer 4 on an encapsulation layer 3 relies on using metal ions and reducing agents in solution. Semiconductor structures, such as semiconductor nanocrystals 2 or agglomerates 5, encapsulated in an encapsulation layer 3 are suspended in a solvent such as water via sonication. A metal ion source such as silver nitrate is added to the solution of the encapsulated semiconductor structures. Additional reagents may be added to the solution to optimize metal deposition and/or surface charge. A reducing agent such as ammonia or amines is then added to the solution to precipitate a metal layer onto the surface of the encapsulated semiconductor structures.

Reaction parameters such as temperature and/or concentration of reagents and reactants will be tuned to meet specific metals and coating targets. Importantly, the metal deposition process may be optimized by functionalizing the metal oxide surface with an intermediate layer such as 3-mercaptopropyltrimethoxy silane to enhance metal adhesion.

FIG. 3 shows a layered arrangement 1. The arrangement 1 comprises two reflective layers 4a, 4b. The reflective layers 4a, 4b comprise or consist of a metal, for example, Ag or Al, a metal alloy, or a Bragg stack.

An encapsulation layer 3 is arranged between the two reflective layers 4a, 4b. The encapsulation layer 3 is thick compared to the thickness of the reflective layers 4a, 4b. In particular, the encapsulation layer 3 is in direct contact to both reflective layers 4a, 4b. The encapsulation layer 3 comprises or consists of a metal oxide, for example, silica.

A plurality of semiconductor structures, for example, a plurality of semiconductor nanocrystals 2, is arranged in at least one monolayer 6 in the encapsulation layer 3 in such a way that each semiconductor structure has essentially the same distance to both reflective layers 4a, 4b. The arrangement comprises, for example, more than one monolayer 6 of semiconductor structures. This is indicated in FIG. 3 with dashed lines 6a, 6b, 6c.

The encapsulation layer 3 can comprise at least two parts 3a, 3b that together form the encapsulation layer 3. In particular, the two parts 3a, 3b of the encapsulation layer 3 are connected to each other by chemical bonds, for example, covalent bonds. As shown in FIG. 3, the encapsulation layer 3 thus embeds the at least one monolayer 6 of semiconductor structures and pervades or penetrates the monolayer 6 in between the individual semiconductor structures. Thus, each semiconductor structure in the monolayer 6 is covered or surrounded by the encapsulation layer 3.

The arrangement 1 of FIG. 3 can be produced as follows. The first reflective layer 4a is applied on, for example, a radiation emission surface of a semiconductor chip by, for example, sputtering or sequential deposition of layers of transparent materials with different refractive indices. The first part 3a of the encapsulation layer 3 is applied on the first reflective layer 4a by wet or dry chemical processes, for example, sol-gel or sputtering. At least one monolayer 6 of semiconductor structures is applied to the first part 3a of the encapsulation layer 3 by, for example, spin coating. The second part 3b of the encapsulation layer 3 is then applied on the at least one monolayer 6. In particular, the second part of 3b of the encapsulation layer 3 pervades or penetrates the monolayer 6 in between the individual semiconductor structures to form covalent bonds to the first part 3a of the encapsulation layer 3. The second reflective layer 4b is applied on the second part of the encapsulation layer 3.

Figure 4:
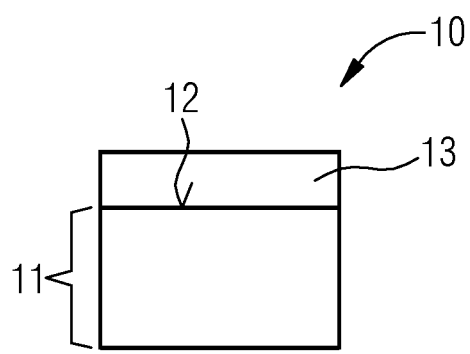
FIGS. 4, 5, and 6 each show a schematic illustration of an optoelectronic device according to different embodiments.
Figure 5:
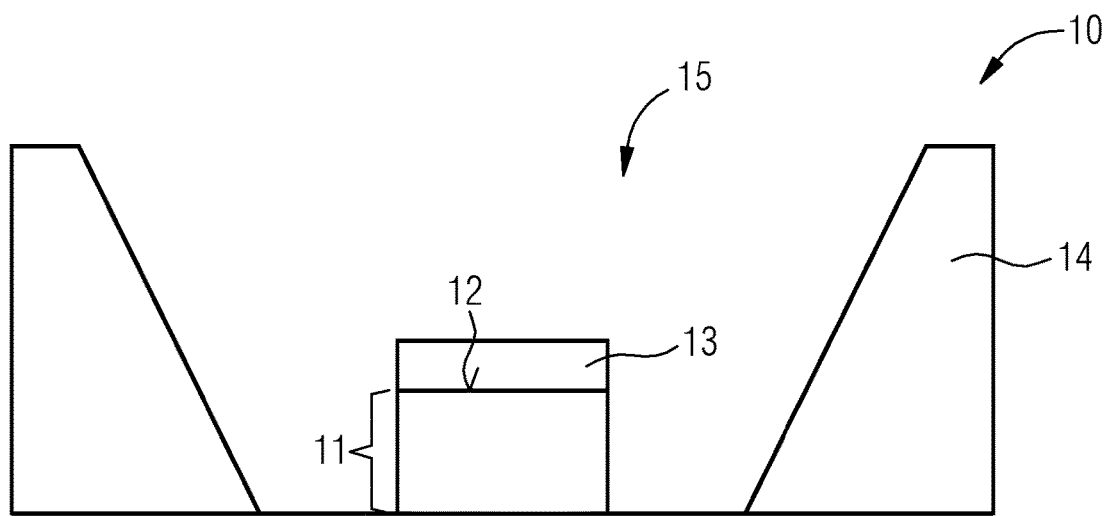
Figure 6:
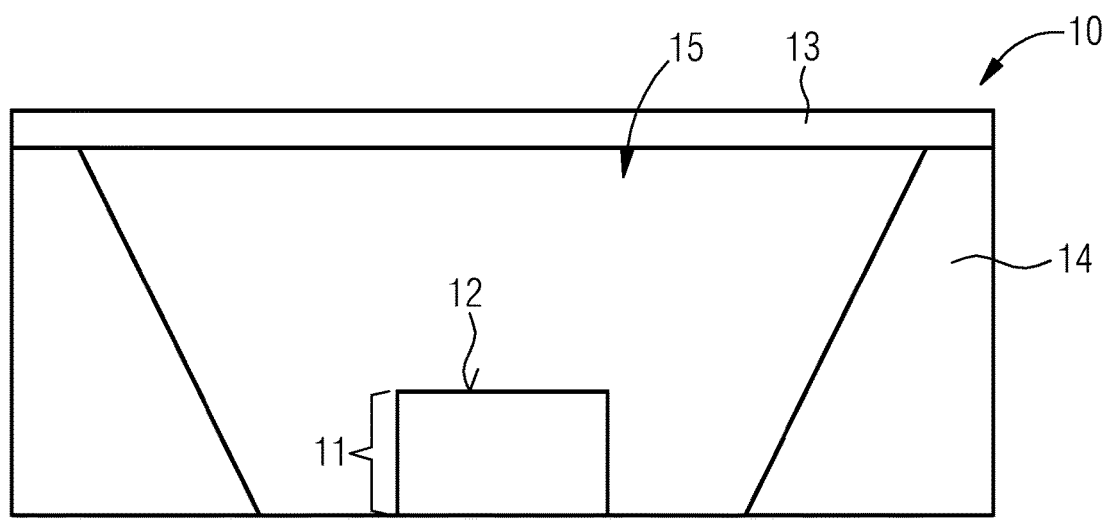

FIGS. 4, 5, and 6 each show a schematic illustration of an optoelectronic device.

FIG. 4 shows an optoelectronic device comprising a semiconductor chip 11 with an active layer stack and an active region (not explicitly shown here). During operation, the semiconductor chip 11 emits a primary radiation, for example, from the radiation emission surface 12. In particular, the primary radiation is electromagnetic radiation in the UV or visible wavelength range, for example, from 300 nm inclusive to 800 nm inclusive.

A conversion element 13 is arranged on the radiation emission surface 12 of the semiconductor chip 11. In particular, the conversion element is arranged in direct contact to the radiation emission surface 12. The conversion element 13 is configured to convert at least part of the primary radiation into a secondary radiation. The secondary radiation is electromagnetic radiation with a wavelength range at least partially, preferably completely, different from the wavelength range of the primary radiation. For example, the conversion element 13 converts the primary radiation into secondary radiation in the visible or infrared wavelength range, for example, from 450 nm inclusive to 1500 nm inclusive.

The conversion element 13 comprises or consists of at least one arrangement 1. For example, the conversion element 13 comprises at least one arrangement 1, preferably a plurality of arrangements 1, as shown in conjunction with FIGS. 1 and 2. In particular, the arrangements 1 are embedded in a matrix material such as silicone, polysiloxane or epoxy.

Alternatively, the conversion element 13 comprises, in particular consists of, an arrangement 1 formed as a layer structure as shown in FIG. 3. In particular, one of the two reflective layers 4a, 4b is arranged in direct contact to the radiation emission surface 12 of the semiconductor chip 11.

As shown in the exemplary embodiment of FIG. 5, the semiconductor chip 11 and the conversion element 13 are arranged in the recess 15 of a housing 14. In particular, the recess 15 can be filled at least partially, preferably completely with an encapsulation such as silicone, polysiloxane or epoxy. In particular, the semiconductor chip 11 and the conversion element 13 are completely embedded in the encapsulation.

In contrast to the exemplary embodiment of an optoelectronic device shown in FIG. 5, the conversion element 13 in the exemplary embodiment of an optoelectronic device shown in FIG. 6 is spaced apart from the semiconductor chip 11. For instance, an encapsulation or other layers or elements can be arranged in the recess 15 between the semiconductor chip 11 and the conversion element 13. Alternatively, the recess 15 is free of an encapsulation or other layers or elements.

Alternatively, the housing 14 can have no side walls and thus no recess 15 and can be formed as a carrier (not shown here).

The features and exemplary embodiments described in connection with the figures can be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

What is claimed is:

1. An arrangement comprising:
   at least one semiconductor structure configured to convert a primary radiation into a secondary radiation;
   an encapsulation layer covering the at least one semiconductor structure;
   at least one reflective layer arranged on the encapsulation layer; wherein the at least one reflective layer is arranged over at least a top side of the at least one semiconductor structure and arranged over at least a bottom side of the at least one semiconductor structure opposite the top side;
   wherein the semiconductor structure is arranged in a center of the arrangement; and
   wherein a lateral extent of the arrangement is chosen such that an optically resonant condition is fulfilled for a wavelength of the secondary radiation in the encapsulation layer.

2. The arrangement according to claim 1, wherein the arrangement comprises exactly one semiconductor structure and, wherein the arrangement is spheroidal.

3. The arrangement according to claim 1, wherein the at least one semiconductor structure is a semiconductor nanocrystal.

4. The arrangement according to claim 1, wherein the at least one semiconductor structure is an agglomerate of a plurality of semiconductor nanocrystals.

5. The arrangement according to claim 4, wherein the agglomerate comprises at least two semiconductor nanocrystals.

6. The arrangement according to claim 1, wherein the encapsulation layer comprises a metal oxide.

7. The arrangement according to claim 1, wherein the at least one reflective layer comprises Ag, Al, Au, Pt, Pd, alloys thereof, or Ni—P alloys.

8. The arrangement according to claim 1, wherein the at least one reflective layer comprises a Bragg stack.

9. The arrangement according to claim 8, wherein the Bragg stack has a good reflectivity for the secondary radiation and a high transmittance for the primary radiation.

10. The arrangement according to claim 1, wherein the arrangement is formed as a layer, and wherein the arrangement comprises at least two reflective layers and a plurality of semiconductor structures.

11. The arrangement according to claim 10, wherein the arrangement comprises at least one monolayer of semiconductor structures arranged in the encapsulation layer between the at least two reflective layers, and wherein each semiconductor structure has essentially the same distance to both reflective layers.

12. An optoelectronic device comprising:
a semiconductor chip configured to emit a primary radiation;
a conversion element configured to convert at least part of the primary radiation into a secondary radiation;
wherein the conversion element comprises or consists of at least one arrangement according to claim 1.

13. The optoelectronic device according to claim 12, wherein the primary radiation is in the visible or UV wavelength range.

14. A method for producing an arrangement, comprising:
providing a semiconductor structure configured to convert a primary radiation into a secondary radiation;
applying an encapsulation layer on the semiconductor structure surrounding the semiconductor structure;
applying a reflective layer on the encapsulation layer surrounding the encapsulation layer; wherein the at least one reflective layer is arranged over at least a top side of the at least one semiconductor structure and arranged over at least a bottom side of the at least one semiconductor structure opposite the top side;
wherein the semiconductor structure is arranged in a center of the arrangement; and
wherein a lateral extent of the arrangement is chosen such that an optically resonant condition is fulfilled for a wavelength of the secondary radiation in the encapsulation layer.

15. The method according to claim 14, wherein the semiconductor structure is a semiconductor nanocrystal or an agglomerate of a plurality of semiconductor nanocrystals.

16. The method according to claim 14, wherein a thickness of the reflective layer is adjusted such that the quantum efficiency has a maximum value.

17. A method for producing an arrangement, comprising:
providing a first reflective layer;
arranging a first part of an encapsulation layer on the first reflective layer;
arranging at least one monolayer of semiconductor structures on the first part of the encapsulation layer;
arranging a second part of the encapsulation layer on the at least one monolayer of the semiconductor structures;
arranging a second reflective layer on the second part of the encapsulation layer;
wherein the first part and the second part of the encapsulation layer form the encapsulation layer; and
wherein a lateral extent of the arrangement is chosen such that an optically resonant condition is fulfilled for a wavelength of the secondary radiation in the encapsulation layer.

18. The method according to claim 17, wherein the semiconductor structures are semiconductor nanocrystals or agglomerates of a plurality of semiconductor nanocrystals.

19. The method according to claim 17, wherein a thickness of the reflective layer is adjusted such that the quantum efficiency has a maximum value.

20. The method according to claim 17, wherein at least five monolayers of semiconductor structures are arranged on the first part of the encapsulation layer.

* * * * *